United States Patent [19]

Schmidt

[11] 4,314,310

[45] Feb. 2, 1982

[54] ELECTRICAL SWITCH

[75] Inventor: Eberhard Schmidt, Grossbettlingen, Fed. Rep. of Germany

[73] Assignee: Gebhard Balluff, Fabrik feinmechanischer Erzeugnisse, Neuhausen, Fed. Rep. of Germany

[21] Appl. No.: 125,216

[22] Filed: Feb. 27, 1980

[30] Foreign Application Priority Data

Mar. 8, 1979 [DE] Fed. Rep. of Germany ....... 2909048

[51] Int. Cl.³ .............................................. H05K 5/00
[52] U.S. Cl. .................................. 361/331; 361/380; 174/52 R; 200/303
[58] Field of Search ............... 200/47, 52 R, 293, 294, 200/295, 296, 302, 303, DIG. 1; 361/365, 369, 370, 371, , 179, 180, 181, 331, 380; 174/52 R, 52 PE; 328/5 R; 307/116, 117; 340/693

[56] References Cited

U.S. PATENT DOCUMENTS

| 3,283,111 | 11/1966 | Wirsching | 200/303 |
| 3,578,932 | 5/1971 | Holmes | 200/302 |
| 4,090,091 | 5/1978 | Brown et al. | 307/116 |

FOREIGN PATENT DOCUMENTS

| 2454764 | 5/1976 | Fed. Rep. of Germany | 174/52 R |
| 2758969 | 9/1978 | Fed. Rep. of Germany | 200/303 |
| 2724939 | 12/1978 | Fed. Rep. of Germany | 200/303 |
| 2339948 | 8/1977 | France | 200/302 |
| 731036 | 6/1955 | United Kingdom | 200/47 |

Primary Examiner—John W. Shepperd
Attorney, Agent, or Firm—Shenier & O'Connor

[57] ABSTRACT

An electrical switch of the type having a holding part and a control part mounted on the holding part by an attachment part, the control part and the attachment part defining a cube divided along a plane of division which forms angles of 45° with the adjacent edges of the cube, the holding part having a front side adjacent to the attachment part which is mounted such that it is pivotable about a first axis perpendicular to said front side, the control part being disposed transposably on the attachment part in such a way that it may be turned relative to the attachment part about a second axis forming an angle of 45° with the first axis so that the control part is mountable in several positions relative to the holding part, in which the improvement is that the plane of division is offset with regard to the diagonal plane of the cube such that the volume of the control part is substantially higher than that of the attachment part (12) with the sensor element and the electric circuitry being completely disposed within the installation cavity of the housing of the control part (14), and a casting resin at least partially filling the installation cavity at least partially to embed the sensor element and said electric circuitry.

8 Claims, 4 Drawing Figures

ELECTRICAL SWITCH

The invention relates to an electrical switch comprising a holding part and a control part, which latter has an operative side and which may be arranged in several positions on the front side of the holding part facing it, such that in a first position the operative side is turned away from the holding part and in further positions it extends in the same direction as side surfaces of the holding part, and comprising an attachment part disposed in a section cut away between the control part and the holding part.

Such an electrical switch, designed as a so-called proximity switch, is already known, in which the front side of the holding part is provided with an extension which is square in plan view and dovetail-shaped in the four side views and which has a central cable duct leading to the inside of the holding part. The control part is in the shape of a cube, one edge region of which is removed so as to produce a rectangular parallelepipedal cutout portion with a square cross-section. In the cutout surfaces and the adjacent outer surfaces there are two recesses, by means of which the control part may be pressed matchingly on to the dovetail-shaped extension of the holding part, whereupon the attachment part is pressed into the cutout portion between the control part and the holding part and is attached by screws to the casing of the control part and in this way the latter is secured to the holding part. A coil, by which the switch is actuated without contact when a metal part is moved sufficiently close, is disposed in a cavity in the casing of the control part behind one wall of the casing remote from the cutout portion. Since, however, threaded bores for fastening the attachment part and the dovetail-shaped recesses extend from the cutout portion towards the two surfaces of the control part remote from the cutout portion, the control part of this known switch can only accommodate coils whose diameter is substantially smaller than the measurement produced by deducting the thickness of the casing walls of the control part from the length of the edges thereof. In addition, the dovetail-shaped recesses and threaded bores extending into the control part restrict the space available for housing the necessary electronic components. Finally, with the known electrical switch, the control part can only be turned in 90° stages about the longitudinal axis of the switch, so that only five separate positions of the operative side are possible (four positions in which the operative side faces in the direction of the four sides of the switch, and one position in which the operative side forms one end face of the switch).

The object of the invention is to design a switch of the type described above such that it is possible to avoid the above-mentioned disadvantages of the known switch, and this object is attained according to the invention in that the attachment part is constructed as a part pivotable about a first axis perpendicular to the front side of the holding part and may be secured to the said front side of the holding part, and that the control part is disposed transposably on the attachment part in such a way that it may be turned about a second axis forming an acute angle with the first axis. By turning the control part 180° about the second axis the operative side may be moved from the end face of the electrical switch to one of its adjacent sides, while by turning the attachment part about the first axis any desired position of the operative side about the first axis may be obtained. With the electrical switch according to the invention the casing cavity of the control part may in principle occupy the whole of its interior, since nothing corresponding to the dovetail-shaped recesses in the central part of the known switch is necessary, and consequently the space behind the surfaces of the control part remote from the cutaway is fully available up to the said cutaway for elements to be accommodated in the control part.

The electrical switch need not necessarily of course be of rectangular parallelepipedal shape, even though it has preferably the shape and dimensions of the limit switch according to DIN (German Industrial Standard) 43 694. In addition, the attachment part need not be pivotable about the first axis, provided it is disposed on the holding part; it could be detached from the latter, turned and then secured again to the holding part. Also, the attachment part need not be continuously pivotable, but could be designed in such a way that it may only occupy distinct angular positions with respect to the first axis. The same applies to the control part, which is preferably designed such that it may be detached from the attachment part, then transposed by turning about the second axis and finally secured again to the attachment part.

A particularly simple and space-saving manner of attaching the control part is obtained if the attachment part contains a screw which is disposed along the second axis and which may be screwed into an internal thread in the control part extending obliquely to the operation side. A single screw is then sufficient, the internal thread does not interfer with the accommodation of components in the control part to any significant extent, and the screw is easily accessible, without the attachment part having to be detached from the holding part for this purpose.

In a preferred embodiment of the switch according to the invention the attachment part and the control part have attachment surfaces perpendicular to the second axis, so that the control part is held rigidly on the attachment part, although only a single screw is used—the above-mentioned attachment surfaces need not of course form continuous surfaces.

An embodiment is preferred in which the attachment part disposed on the holding part may be rotated through at least 270° relative to the latter, i.e. in which the attachment part may be rotated relative to the holding part without it having to be completely removed first. An angle of rotation of 270° is sufficient to ensure that the operative side of the control part can be set towards all four sides of the holding part.

As already mentioned, with the same dimensions the control part of the switch according to the invention can accommodate coils of greater diameter than the control part of the known switch described above; this is important because the response distance of a proximity switch actuated without contact may be increased with the diameter of the coil. It should be made clear in this connexion, however, that the invention is not limited to proximity switches, but that the arrangement according to the invention of the various parts of the switch also provides advantages if for example a so-called rocker lever switch is involved.

Further features, advantages and details of the invention may be seen in the attached claims and/or the following description and the preferred embodiment, illustrated in the attached drawing, of a switch according to the invention which is constructed as a proximity switch; in the drawing.

Figure 1:
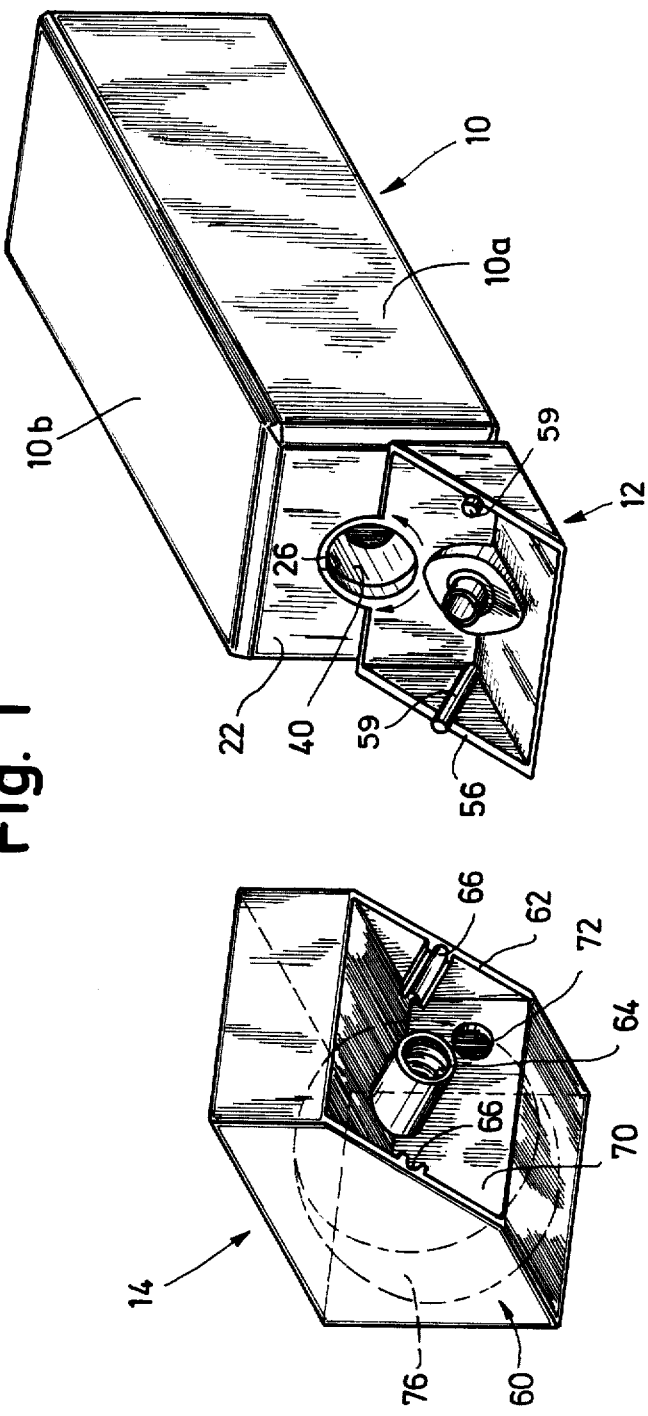
FIG. 1 is a diagrammatic view of the switch with the control part detached.
Figure 2:
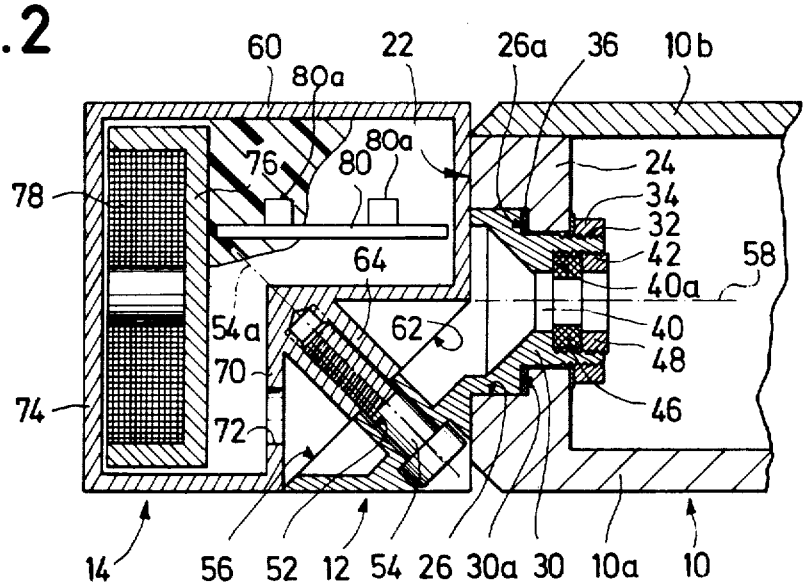
FIG. 2 is a section through the front portion of the holding part and through the attachment part and the control part, the latter occupying a first position in which its operative side forms the front end of the switch.
Figure 3:
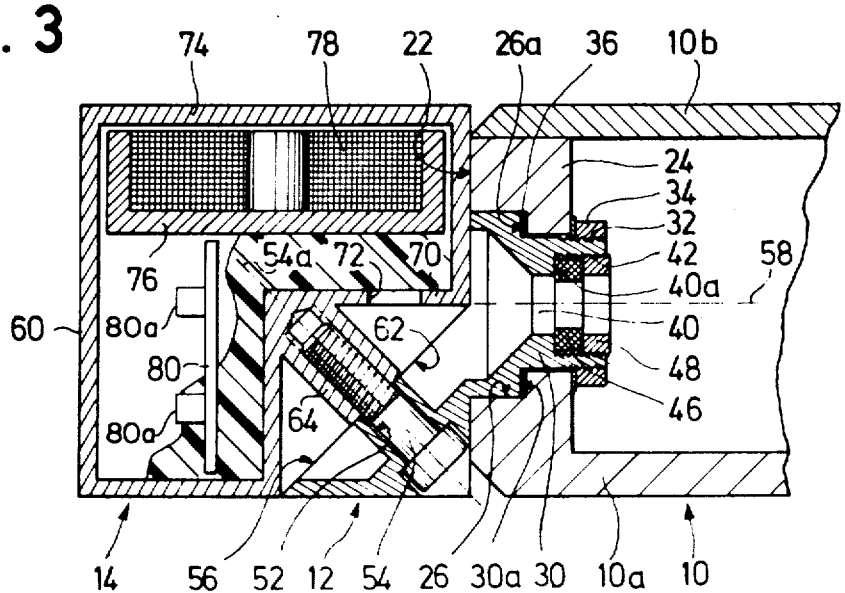
FIG. 3 is a section corresponding to FIG. 2, in which however the control part is transposed, so that its operative side is in alignment with one of the side faces of the holding part.
Figure 4:
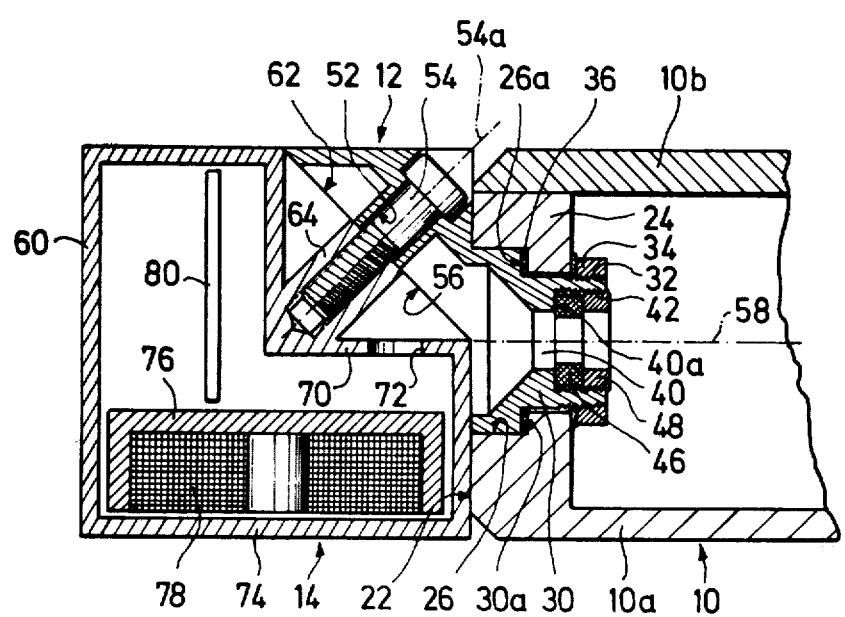
FIG. 4 is a view corresponding to FIG. 3, in which however the control part has been turned about the longitudinal axis of the switch with respect to the position shown in FIG. 3.

The electrical switch illustrated has a holding part 10 with a casing forming a trough 10a and a lid 10b, an attachment part 12 and a control part 14. The lid 10b of the holding part 10 is attached to the trough 10a in a manner not shown in greater detail, the said trough 10a having a front wall 24 forming a front side 22 with a stepped bore 26. The shoulder formed by the latter is designated 26a.

The attachment part 12 is approximately in the shape of a gabled roof and is provided with a stepped, tenon-like extension 30 which is inserted in a matching manner into the bore 26 of the holding part 10 and may be rotated continuously in the latter through 360°; the shoulder formed by the step on the extension is designated 30a. The end of the extension 30 facing the inside of the holding part 10 has an external thread 32, on to which a clamping nut 34 may be screwed. In this way, not only is the attachment part 12 secured with respect to the holding part 10, but in addition an elastomeric sealing ring 36 may be pressed between the shoulders 26a and 30a in order to be able to seal the inner cavity of the holding part 10 at this point.

The extension 30 also has a central cable duct 40 and, in order to avoid a leakage point at the cable passage, the cable duct is stepped so as to form a shoulder 40a, and in addition an internal thread 42 is provided at the end of the cable duct towards the holding part, so that an elastomeric cable sealing ring 46 may be deformed in such a way by a thrust collar screw 48 screwed into the internal thread 42 that it is pressed sealingly in the radial direction against the cable (not shown).

The triangular—when viewed laterally—area of the attachment part 12 has a guide 52 for a socket head cap screw 54 which extends at right angles to an attachment surface of the attachment part designated 56 in FIG. 1 and at 45° to the axis of the extension 30 of the bore 26 designated 58. The axis of the screw 54 is designated 54a. In addition, pin-shaped guiding projections 59 are formed on the attachment part 12.

The control part 14 would have the shape of a cube, had not an edge portion in the shape of a gabled roof been removed. In this way an attachment surface 62, the position and shape of which correspond to those of the attachment surface 56 of the attachment part 12, is formed on the casing 60 of the control part 14. According to the invention both the attachment surfaces define a square. A screw socket 64 for the screw 54 and guides 66 for the guiding projections 58 are formed on the casing 60, and in addition the said casing 60 has an opening 72, through which a cable may be led from the interior of the casing of the control part 14, in the area of a wall 70 facing the attachment part 12; this cable is then led through the attachment part 12 and the cable duct 40 into the interior of the holding part 10.

A coil 78 accommodated in a so-called cup core 76 is disposed behind the wall designated 74 of the casing 60 of the control part 14, so that the wall 74 forms the operative side of the control part 14. According to the invention the cup core 76 can have a diameter which corresponds to the length of the edges of the casing 60 of the control part 14 minus the two wall thicknesses of the casing. In addition, according to the invention, a plate 80, which extends approximately at right angles to the wall 74, is disposed behind the coil 78 and the cup core 76, and finally, according to the invention, the inner cavity of the casing 60 is filled with a resin (not shown); the filling is carried out after the cup core 76 with the coil 78 and the plate 80 carrying electrical components 80a have been fitted in the casing 60 and the cable (not shown) has been led out of the opening 72—one of the walls of the casing 60 must of course originally have formed a separate piece, in order to be able to insert the coil and the plate.

In order to be able to establish defined positions of the control part 14 with respect to the angle of rotation about the axis 58, arresting means may be provided, for example in the form of small studs and corresponding recesses in the surfaces of the control part 14 and the end wall 24 facing one another.

I claim:

1. An electrical switch comprising a holding part (10) and a control part (14) mounted at said holding part by means of an attachment part (12), the control part (14) and the attachment part (12) defining together a cube being divided along a plane of division (56) which forms angles of 45° with the adjacent edges of the cube, the control part (14) having a housing (60) with a front wall (74) defining an operative side of said control part and four adjacent side walls embracing an installation cavity for accommodating a sensor element (76, 78) and electric circuitry means (80) connected thereto, said holding part (10) having a front side (22) adjacent to said attachment part (12) which is mounted such that it is pivotable about a first axis (58) perpendicular to said front side (22), said control part (14) being disposed transposably on the attachment part (12) in such a way that it may be turned relative to the attachment part about a second axis (54a) forming an angle of 45° with said first axis (58) so that the control part (14) is mountable in several positions relative to said holding part (10) such that in a first position said front wall (74) is turned away from the holding part (10) and in further positions it extends parallel to said first axis (58), the improvement comprising said plane of division (56) being offset with regard to the diagonal plane of the cube such that the volume of the control part (14) is substantially higher than that of the attachment part (12), said sensor element (76, 78) and said electric circuitry means (80) connected thereto being completely disposed within the installation cavity of the housing (60) of said control part (14), and a casting resin at least partially filling said installation cavity at least partially to embed said sensor element and said electric circuitry means.

2. A switch according to claim 1 in which said attachment part (12) has a tenon-shaped extension (30) extending in the direction of the first axis (58) and insertable into an opening (26) in the front side (22) of the holding part (10) by means of said extension (30).

3. A switch according to claim 2, wherein the extension has an external thread (32) onto which a clamping nut (34), which may be tightened against the inside of the front wall of the holding part (10), may be screwed.

4. A switch according to claim 2 or 3, wherein said extension has a sealing shoulder (30a) towards the holding part (10) and the front wall (24) of the holding part has a correspondingly stepped opening (26).

5. A switch according to claim 2, wherein said extension has a cable duct (40).

6. A switch according to claim 5, wherein said cable duct is stepped and has an internal thread (42) for a thrust collar screw (48), between which and a shoulder (40a) formed by the wall of the cable duct an elastomeric cable packing ring (46) may be gripped.

7. A switch according to claim 1, wherein said control part (14) has a cavity embraced by at least a front wall (74) and four side walls and the dimensions of which behind said front wall (74) correspond to the external measurements of the control part (14) minus the thickness of said side walls.

8. A switch according to claim 7, wherein said casing cavity of the control part (14) accommodates a coil (76, 78) behind said front wall (74) and, eccentrically behind said coil, a board (80) with electronic components which extends approximately perpendicularly to the said front wall (74).

* * * * *